United States Patent
Rotay et al.

(10) Patent No.: US 8,980,747 B2
(45) Date of Patent: Mar. 17, 2015

(54) METHOD AND SYSTEM FOR PRE-MIGRATION OF METAL IONS IN A SEMICONDUCTOR PACKAGE

(71) Applicant: STMicroelectronics, Inc., Coppell, TX (US)

(72) Inventors: Craig J. Rotay, Audubon, PA (US); John C. Pritiskutch, Orwigsburg, PA (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/023,255

(22) Filed: Sep. 10, 2013

(65) Prior Publication Data
US 2014/0077346 A1    Mar. 20, 2014

Related U.S. Application Data

(63) Continuation of application No. 12/806,428, filed on Aug. 12, 2010, now Pat. No. 8,557,703.

(51) Int. Cl.
| H01L 21/445 | (2006.01) |
| H01L 21/48 | (2006.01) |
| H01L 23/495 | (2006.01) |
| H01L 23/00 | (2006.01) |

(52) U.S. Cl.
CPC ...... *H01L 21/4821* (2013.01); *H01L 23/49582* (2013.01); *H01L 23/564* (2013.01); *H01L 23/49517* (2013.01); *H01L 2924/0002* (2013.01)

USPC .................................. 438/677; 257/E21.174

(58) Field of Classification Search
CPC ............ H01L 29/665; H01L 21/28518; H01L 21/28052; H01L 21/2885
USPC .................................. 257/E21.174; 438/677
See application file for complete search history.

(56) References Cited

U.S. PATENT DOCUMENTS

| 6,251,787 | B1 * | 6/2001 | Edelstein et al. | 438/692 |
| 2002/0153257 | A1 * | 10/2002 | Leverrier et al. | 205/118 |
| 2004/0089882 | A1 * | 5/2004 | Aono et al. | 257/212 |
| 2006/0088996 | A1 * | 4/2006 | Wu et al. | 438/637 |

* cited by examiner

*Primary Examiner* — Steven J Fulk
(74) *Attorney, Agent, or Firm* — Allen, Dyer, Doppelt, Milbrath & Gilchrist, P.A.

(57) ABSTRACT

Pre-migration of metal ions is achieved in a controlled manner to form a migrated metal over which an inhibitor is applied to prevent further migration. In a semiconductor circuit, pre-migration of metal ions is achieved by exposing a joined metal system to water, oxygen and an electrical field in a controlled manner. Conductors, joined to electrically isolating materials, are exposed to electrical fields in such a manner as to form one or more anodes to corresponding cathodes, thus liberating metal ions.

The metal ions are then allowed to migrate in a controlled manner from the anode toward the cathode to form a pre-migrated metal. Finally, an inhibitor is applied on top of the pre-migrated metal to prevent further migration.

18 Claims, 2 Drawing Sheets

METHOD AND SYSTEM FOR PRE-MIGRATION OF METAL IONS IN A SEMICONDUCTOR PACKAGE

The present application is a continuation of, and incorporates by reference, U.S. patent application Ser. No. 12/806,428 filed Aug. 12, 2010, entitled "METHOD AND SYSTEM FOR PRE-MIGRATION OF METAL IONS IN A SEMICONDUCTOR PACKAGE," now U.S. Pat. No. 8,557,703.

TECHNICAL FIELD

The present disclosure is directed, in general, to semiconductor packages, and more specifically, to a method and system for pre-migration of metal ions in a semiconductor package.

BACKGROUND

Dendrite growth in semiconductor packages can devastatingly interrupt the proper operation of a semiconductor circuit. To avoid such growth, some semiconductor packages attempt to seal the semiconductor such that it will not be exposed to air. Unfortunately, however, air can leak into such packages, thwarting such attempts to limit the dendrite growth.

SUMMARY

According to an embodiment of the present disclosure, a method of pre-migrating metal ions is disclosed. A metal in a semiconductor configuration is exposed to water and oxygen to yield metal ions. The metal couples a conductor to another material. The metal and the conductor are exposed to an electrical field in such a manner that one or both of the metal and the conductor becomes an anode to a corresponding cathode. The metal ions are then allowed to migrate from the anode to the cathode to form a migrated metal. Finally, an inhibitor is applied on top of the migrated metal to prevent further migration.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
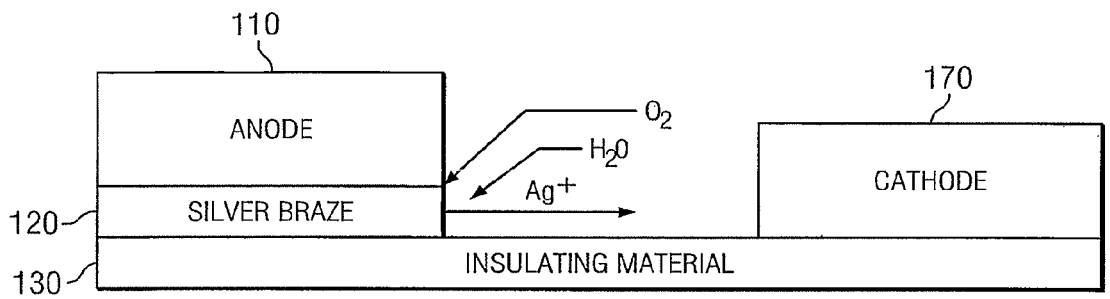
FIG. 1 illustrates the phenomena of metal migration, in particular, with reference to silver.
Figure 2:
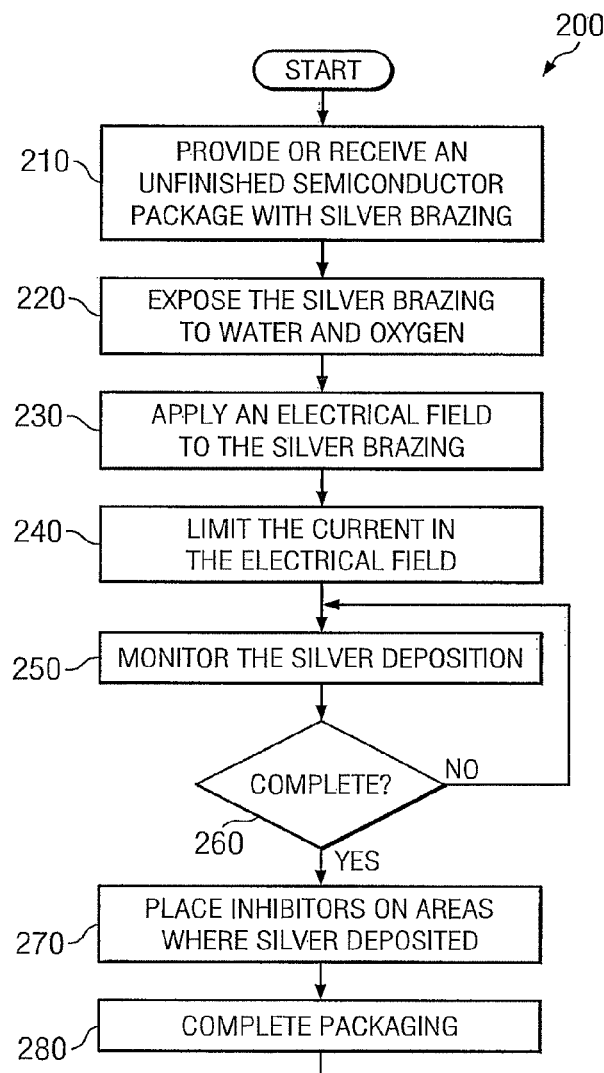
FIG. 2 illustrates a process for controlling metal migration, according to an embodiment of the disclosure.
Figure 3:
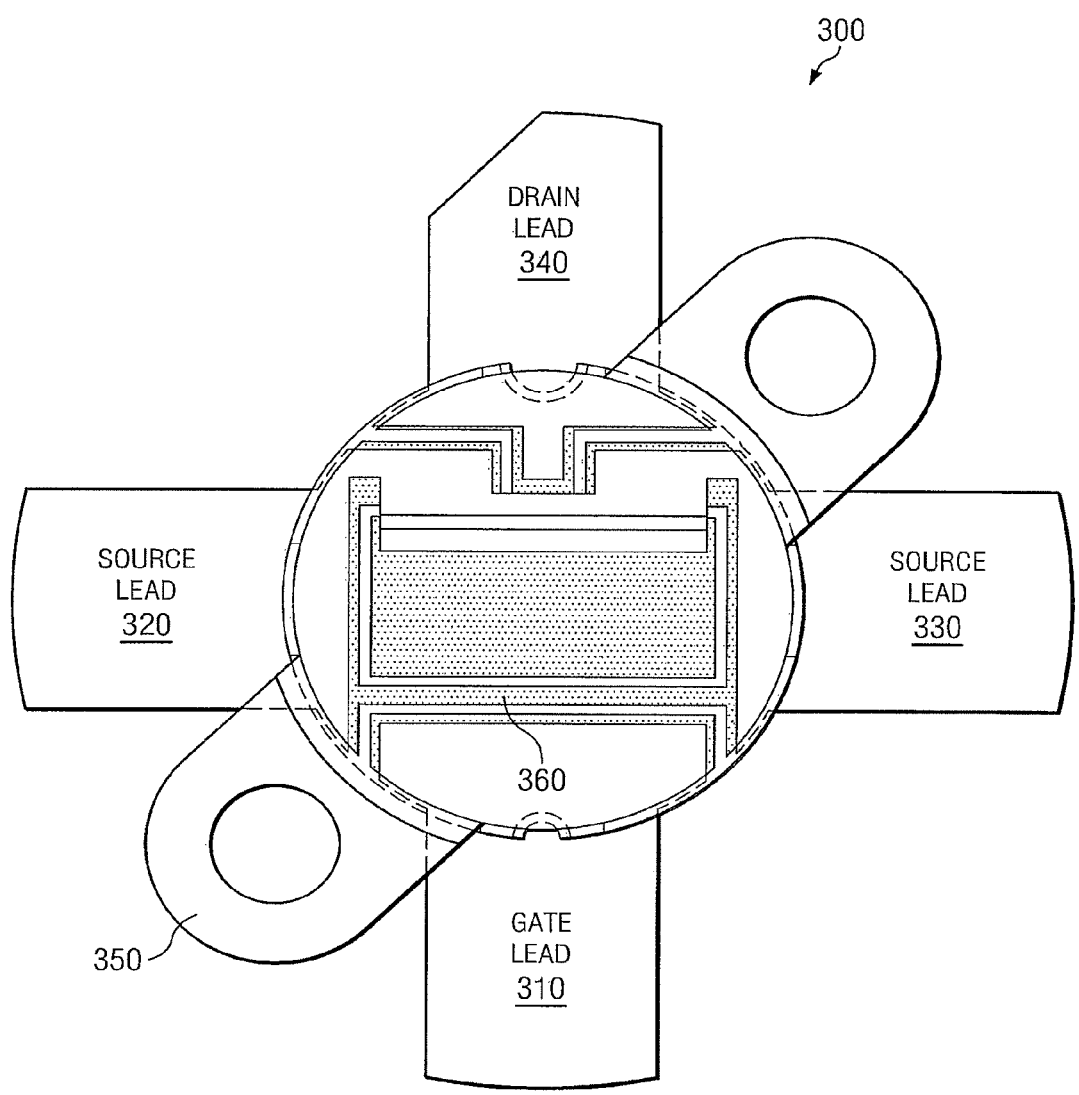
FIG. 3 shows a semiconductor package configuration 300 according to an embodiment of the disclosure.

FIGS. 1 through 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system.

In the semiconductor packaging industry, specifically in package systems designed to house power semiconductors, it is desirable to incorporate materials that have a sound history and well defined characteristics. Such packaging normally consists of a ceramic frame onto which leads are joined, forming what is commonly referred to as a leadframe.

The leads, themselves, normally consist of an industry accepted material such as Alloy42 ($FeNi_{42}$) or KOVAR®, which may be joined to the ceramic using a silver filled braze material or silver epoxy. The frame may be made of an insulating material such as alumina (also known as $Al_2O_3$), which isolates individual leads from one another. In some designs, the frame may be made of beryllium oxide (also known as BeO), which has electrical insulation properties and high thermal conductivity.

An alumina leadframe is ultimately joined to a metallic base onto which one or more semiconductor die are placed such that an electrical and thermal connection between the die and an external heatsink are thus formed.

In a beryllium oxide leadframe, one or more semiconductor die may be mounted on top of the beryllium oxide such that the dies are electrically isolated from, yet thermally connected to, an interposing metallic base layer. A beryllium oxide leadframe is usually ultimately joined to an interposing metallic base layer to form a continuous thermal path between dies and the heatsink while at the same time electrically isolating the die from the external heatsink.

Both alumina leadframes and beryllium oxide leadframes may be joined to the metallic base layer by way of a silver braze material or silver epoxy in the same manner as leads are joined to the ceramic materials.

In the final preparation of such packages for use, a layer of nickel and a layer of gold may be plated over the metallic surfaces. These layers provide a robust bonding layer as well as a protective or inhibitor layer against corrosion and migration effects which can occur from environmental influences, such as moisture. Even though the internal air cavity, which is formed after sealing the package with epoxy and a ceramic lid, is mostly protected from outside environmental influences, the nature of the epoxy material is organic and can only provide a limited barrier to moisture intrusion. Such packages are known in the industry as non-hermetic, air-cavity, ceramic packages.

One undesirable characteristic of such packages is that, over time, moisture from outside the cavity can diffuse through the interface between the lid and the package formed by the organic epoxy layer. When this occurs, silver may migrate across the internal electrical terminals in regions where the silver braze material or silver epoxy is concentrated when both an electrical field and moisture are present. Such silver migration can be extensive enough to form an electrical connection between the terminals, thus causing an electrical short which destroys the proper functioning of the device.

FIG. 1 illustrates the phenomena of metal migration, in particular, with reference to silver. Although this process may be alternatively expressed, the following is one general way of explaining silver migration. A pair of conductive devices 110, 170 may be disposed on an insulating material 130. Conducting device 110 is shown as the anode and conductive device 170 is shown as the cathode. As referenced above, a commonly used brazing material or epoxy, which may be used for one or both of the conducting devices 110, 170, is a silver braze or silver epoxy 120.

When the silver in the silver braze or silver epoxy 120 is exposed to oxygen, for example, in ambient air, the silver may oxidize according to the following formula:

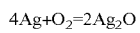

After oxidizing, the silver may ionize upon exposure to water, which may be present as humidity in ambient air:

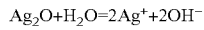

The silver ions, under the influence of an applied voltage, may then migrate from the conductive device 110 (the anode) to the conducting device 170 (the cathode) through a process known as ionic conduction. When the silver ion picks up an electron from the cathode, the silver ion reverts back to silver. The uncontrolled and undesirable accumulation of silver is commonly referred to as a "dendrite."

Given the negative effects of metal migration in semiconductor packaging, certain embodiments herein disclose a system and methods that renders the metal (e.g., silver) participating in the migration activity ineffective. According to certain embodiments, such a process and method eliminate the possibility of deleteriously affecting the semiconductor device.

FIG. 2 illustrates a process 200 for controlling metal migration, according to an embodiment of the disclosure. This process 200 may be applied, for example, to a semiconductor package configuration 300 (shown in FIG. 3). At step 210, an unfinished semiconductor package with silver brazing or silver epoxy may be received or provided. Although step 210 describes an "unfinished semiconductor package," in particular embodiments, the semiconductor packaging, itself, may be in a substantially finished state or a finished state.

In particular embodiments, the silver brazing or silver epoxy may be used to couple a conductor or conductive device (e.g., a lead made of Alloy 42 or KOVAR®) to a ceramic leadframe made of alumina or beryllium oxide. In other embodiments, the conductor or conductive device may be other than a lead and may be made of materials other than Alloy 42 or KOVAR®. Additionally, the conductor or conductive device may be mounted to other types of material—other than alumina or beryllium oxide. Further, while this process is described with reference to a metal migration, it may be applicable to other types of migration that may occur through ionic conduction.

At step 220, the silver brazing or silver epoxy may be exposed to water and oxygen. This procedure may be carried out in a variety of different manners. In certain embodiments, the water exposure can come from water present in air. In such an embodiment, increased water exposure may occur by increasing the relative humidity of the air in a controlled environment. In other embodiments, the silver brazing or silver epoxy may be exposed to water through a spraying of water (e.g., in a controlled mist) onto the silver brazing or silver epoxy. In yet other embodiments, the silver brazing or silver epoxy may be placed within a bath of water.

Like water exposure, oxygen exposure in step 220 may also take on a variety of different forms. In particular embodiments, the oxygen may come from the air. In other embodiments, oxygen levels in the air may be elevated, for example, by pumping oxygen into a controlled room or chamber. In a bath of water setting, oxygen may be bubbled up through water.

At step 230, an electrical field may be applied to the silver brazing/silver epoxy and/or conducting device/conductor in such a manner that the one or both of the silver brazing/silver epoxy and conducting device/conductor becomes an anode while another device becomes a cathode. In particular embodiments, the corresponding cathode may either be another component on the unfinished semiconductor package. In other embodiments, the cathode may be a component that is not on the unfinished semiconductor package.

At step 240, the current of the electrical field between the anode and cathode is limited (e.g., using appropriate current resistance) in order to control the rate at which silver migrates away from the anode towards the cathode. By controlling the rate, controlled redistribution of silver can occur. In embodiments in which the cathode is another component in the semiconductor package, all available silver may be redistributed to an area of the package which cannot participate in further migration under normal operating and environmental conditions.

At step 250, the silver deposition can be monitored. As the silver deposition progresses, any necessary modifications may be made to any of the control parameters (e.g., current, water, or oxygen).

At decisional step 260, the process 200 may determine whether or not the silver deposition is complete. If not, the process may return back to monitoring at step 250. If the deposition is complete, the process 200 may move to step 270 where inhibitors may be placed at the location of the migrated and deposited silver to prevent further migration. Examples of inhibitors include, but are not limited to tin, nickel, and gold. According to certain embodiments, step 270 provides a benefit in that it may be easier to place an inhibitor at the location of where the silver is ultimately deposited than the original location of the silver in the silver braze or silver epoxy.

At step 280, the completion of the semiconductor package may be completed using any technique, including conventional technique such as those described above (e.g., sealing the package with epoxy and a ceramic lid).

FIG. 3 shows a semiconductor package configuration 300 according to an embodiment of the disclosure. As described below, the semiconductor configuration 300 may use the process 200 to pre-migrate a metal such as silver.

The semiconductor configuration of FIG. 3 is an enhancement mode, double-bonded source metal oxide semiconductor field effect transistor (MOSFET). Although a particular semiconductor configuration is shown in this embodiment, other semiconductor configurations may avail from teachings of the disclosure, including but not limited to other MOSFET configurations, other transistor configurations, and other semiconductor packages that include die and/or use silver or other metal as a bonding material. It should be understood that the particular semiconductor package configuration 300 of FIG. 3 is provided for illustrative purposes only.

The semiconductor package configuration 300 includes a gate lead 310, source leads 320 and 330, and a drain lead 340. Each respective lead may be bonded to a ceramic metallization pattern leadframe 360 using silver brazing or silver epoxy as described above. The leads 320 and 330 and the leadframe 360 may be made of any suitable materials, including those described herein.

The operation of the semiconductor package configuration 300 shown in FIG. 3 is generally recognized. A signal (or lack thereof) is sent to the gate lead 310, which may allow current to travel from the source leads 320, 330 to the drain lead 340 or vice versa. A copper flange 350 may be provided to allow the package to be secured to a printed circuit board (PCB) or the like.

In operation, there may be a voltage differential between the gate lead 310 and the source leads 320, 330. As an illustrative example, there may be a 3-5 volt differential in some embodiments. In other embodiments, this voltage differential may be more than or less than 3-5 volts. As described above, there may be a tendency for silver to migrate from the gate lead 310 to the source leads 320, 330 when oxygen and water are present. Additionally, in some configurations, the silver may also migrate from the gate lead 310 to the drain lead 340. In such a migration setting, the gate lead 310 becomes the anode and the source leads 330 (or alternatively the drain lead 340) become the cathodes. If this migration is uncontrolled, a low impedance path may be created. Ultimately, an undesired debiasing (or biasing—depending on the configuration) may occur in the semiconductor package configuration 300.

Because this silver migration phenomena is expected to occur, teachings of this disclosure recognize that the semiconductor package configuration 300 can pre-empt an uncontrolled migration by purposefully pre-migrating the silver in a controlled manner to a desired area of the semiconductor package configuration 300. As an illustrative example, in particular embodiments, using the process 200 (or similar process), silver can be pre-migrated from the gate-lead 310 toward the source lead 320 in a controlled manner using a limited current, oxygen, and water. As referenced in the process 200 of FIG. 2, in particular embodiments this can be carried out before the semiconductor package is completed. Then, after the silver is pre-migrated to the source leads 320 and 330, the source leads 320 and 330 may be plated with an inhibiting material such as tin, nickel, or gold. In particular configurations, the plating of the source leads 320 and 330 may provide an additional benefit because it may be easier to plate source leads 320, 330 than it is to plate gate leads 310.

As can be seen above, certain embodiments disclose a process that purposefully ionizes the source of silver and permanently relocates the ionized silver to regions where the silver can no longer participate in the formation of a conductive path.

In particular embodiments, this process includes deliberately exposing the semiconductor package to humid air and applying an electrical field such that any available silver is ionized. As indicated with certain embodiments disclosed above, the electrical field may be limited such that a controlled migration of silver across the terminals is initiated and continued until all available silver is uniformly redistributed to an area of the package which cannot participate in further migration under normal operating and environmental conditions. By limiting the field, the rate at which the silver is ionized decreases. With the relocation of the silver, electrically conductive paths do not form in any specific regions. Accordingly, the possibility of an unintended electrical connection is eliminated.

Although the above description is made in connection with specific exemplary embodiments, various changes and modifications will be apparent to and/or suggested by the present disclosure to those skilled in the art. It is intended that the present disclosure encompass all such changes and modifications as fall within the scope of the appended claims.

What is claimed is:

1. A method, comprising:
exposing a metal coupling a conductor to a first material in a first area of a semiconductor substrate to water and oxygen to yield metal ions from the metal, wherein at least one of the metal and the conductor forms an anode;
exposing the metal and the conductor to an electrical field having a magnitude selected to cause the metal ions to migrate from the anode toward a cathode in a controlled manner in response to at least the electrical field; and
applying an inhibiting material over a region formed by the migrated metal ions, between the migrated metal ions and the anode, to inhibit further migration of the metal ions from the metal;
wherein the semiconductor substrate includes a metal oxide semiconductor field effect transistor (MOSFET) having a gate lead forming the anode and a source lead forming the cathode.

2. The method of claim 1, further comprising:
exposing the metal to the electrical field prior to packaging the semiconductor substrate.

3. The method of claim 1, wherein the first material is an electrical insulating material, and wherein the metal couples the conductor to the electrical insulating material.

4. The method of claim 1, wherein the conductor is a lead for a leadframe.

5. The method of claim 1, wherein the metal includes silver, and wherein the metal ions are silver ions.

6. The method of claim 5, wherein the inhibiting material inhibitor includes one or more of tin, nickel, and gold.

7. A semiconductor structure, comprising:
a metal coupling a conductor to a first material in a first area of a semiconductor substrate, wherein at least one of the metal and the conductor forms an anode;
a region of migrated metal ions accumulated between the anode and a cathode, wherein an extent of the region or migrated metal ions corresponds at least to application in a controlled manner of an electrical field between the anode and the cathode; and
an inhibiting material over the region formed by the migrated metal ions, between the migrated metal ions and the anode, inhibiting further migration of the metal ions from the metal;
wherein the semiconductor substrate includes a metal oxide semiconductor field effect transistor (MOSFET) having a gate lead forming the anode and a source lead forming the cathode.

8. The semiconductor structure of claim 7, wherein the semiconductor substrate is not completely packaged.

9. The semiconductor structure of claim 7, wherein the first material is an electrical insulating material, and wherein the metal couples the conductor to the electrical insulating material.

10. The semiconductor structure of claim 7, wherein the conductor is an lead for a leadframe.

11. The semiconductor structure of claim 7, wherein the metal includes silver, and wherein the metal ions are silver ions.

12. The semiconductor structure of claim 11, wherein the inhibiting material inhibitor includes one or more of tin, nickel, and gold.

13. A method, comprising:
exposing a metal coupling a conductor to a first material in a first area of a semiconductor substrate to an electric field having a magnitude selected to cause the metal ions to migrate from at least one of the metal and the conductor toward a cathode in a controlled manner in response to at least the electrical field; and applying an inhibiting material over a region formed by the migrated metal ions, between the migrated metal ions and the anode, to inhibit further migration of the metal ions from the metal;

wherein the semiconductor substrate includes a metal oxide semiconductor field effect transistor (MOSFET) having a gate lead forming the metal and a source lead forming the cathode.

14. The method of claim 13, further comprising:
exposing the metal to the electrical field prior to packaging the semiconductor substrate.

15. The method of claim 13, wherein the first material is an electrical insulating material, and wherein the metal couples the conductor to the electrical insulating material.

16. The method of claim 15, wherein the conductor is a lead for a leadframe.

17. The method of claim 13, wherein the metal includes silver, and wherein the metal ions are silver ions.

18. The method of claim 17, wherein the inhibiting material inhibitor includes one or more of tin, nickel, and gold.

* * * * *